(12) United States Patent
Deng et al.

(10) Patent No.: US 12,093,476 B2
(45) Date of Patent: Sep. 17, 2024

(54) TOUCH SENSOR AND METHOD FOR MAKING THE SAME

(71) Applicant: NUOVO FILM SUZHOU CHINA INC., Suzhou (CN)

(72) Inventors: Biao Deng, Suzhou (CN); Jie Ma, Suzhou (CN); Bei Lei, Suzhou (CN); Kai Jiang, Suzhou (CN); Hak Fei Poon, Suzhou (CN)

(73) Assignee: NUOVO FILM SUZHOU CHINA INC., Suzhou (CN)

( * ) Notice: Subject to any disclaimer, the term of this patent is extended or adjusted under 35 U.S.C. 154(b) by 145 days.

(21) Appl. No.: 17/609,399

(22) PCT Filed: Nov. 22, 2019

(86) PCT No.: PCT/CN2019/120161
§ 371 (c)(1),
(2) Date: Nov. 7, 2021

(87) PCT Pub. No.: WO2020/233040
PCT Pub. Date: Nov. 26, 2020

(65) Prior Publication Data
US 2022/0221949 A1     Jul. 14, 2022

(30) Foreign Application Priority Data
May 17, 2019    (CN) .......................... 201910409860.3

(51) Int. Cl.
*G06F 3/041* (2006.01)
*H05K 3/20* (2006.01)

(52) U.S. Cl.
CPC .......... *G06F 3/041* (2013.01); *G06F 3/04164* (2019.05); *H05K 3/20* (2013.01); *G06F 2203/04103* (2013.01)

(58) Field of Classification Search
CPC ........... G06F 2203/04103; G06F 3/041; G06F 3/04164; H05K 3/20
See application file for complete search history.

(56) References Cited

U.S. PATENT DOCUMENTS

2015/0177878 A1*  6/2015  Cheng ................... G06F 3/0448
                                                                 345/174
2016/0124547 A1*  5/2016  Yin ........................ G06F 3/0443
                                                                 345/174
2022/0221949 A1*  7/2022  Deng ................... G06F 3/04164

FOREIGN PATENT DOCUMENTS

| CN | 101950230 A | 1/2011 |
|---|---|---|
| CN | 102478992 A | 5/2012 |
| CN | 105549798 A | 5/2016 |
| CN | 110119224 A | 8/2019 |
| CN | 209625182 U | 11/2019 |

(Continued)

*Primary Examiner* — Minh N Trinh
(74) *Attorney, Agent, or Firm* — Cheng-Ju Chiang (57) ABSTRACT

The present invention provides a touch sensor and a method for making the same. The touch sensor includes a substrate, an electrode layer located in a window area, and a frame trace located in a frame trace area. The frame trace includes a plurality of metal wires. Each metal wire includes a metal wire body electrically connected to a corresponding electrode in the electrode layer and an insulation layer wrapped around an outer periphery of the metal wire body. In this way, the width of the frame trace area can be further reduced.

9 Claims, 5 Drawing Sheets

(56) References Cited

FOREIGN PATENT DOCUMENTS

| JP | 3217788 U | 8/2018 | | |
|----|-----------|--------|---|---|
| WO | WO-2018076817 A1 | * | 5/2018 | ........... G03F 7/0007 |

* cited by examiner

TOUCH SENSOR AND METHOD FOR MAKING THE SAME

CROSS REFERENCE TO RELATED APPLICATIONS

The present application is a 35 U.S.C. § 371 National Phase conversion of International (PCT) Patent Application No. PCT/CN2019/120161, filed on Nov. 22, 2019, which claims priorities of a Chinese Patent Application No. 201910409860.3, filed on May 17, 2019, the disclosure of which is incorporated by reference herein. The PCT International Patent Application was filed and published in Chinese.

TECHNICAL FIELD

The present invention relates to the field of touch screens, and in particular, to a touch sensor and a method for making the same.

BACKGROUND

With the continuous development of touch screen devices, touch devices have been rapidly promoted. At present, touch devices have increasingly high requirements for lightness, thinness, and high quality. The narrow bezel technology has always been a technology for improving product texture. However, a larger screen indicates a larger number of frame traces and a wider overall frame. However, a narrower frame of the touch device has a higher requirement for the frame traces of the touch sensor.

Figure 1:
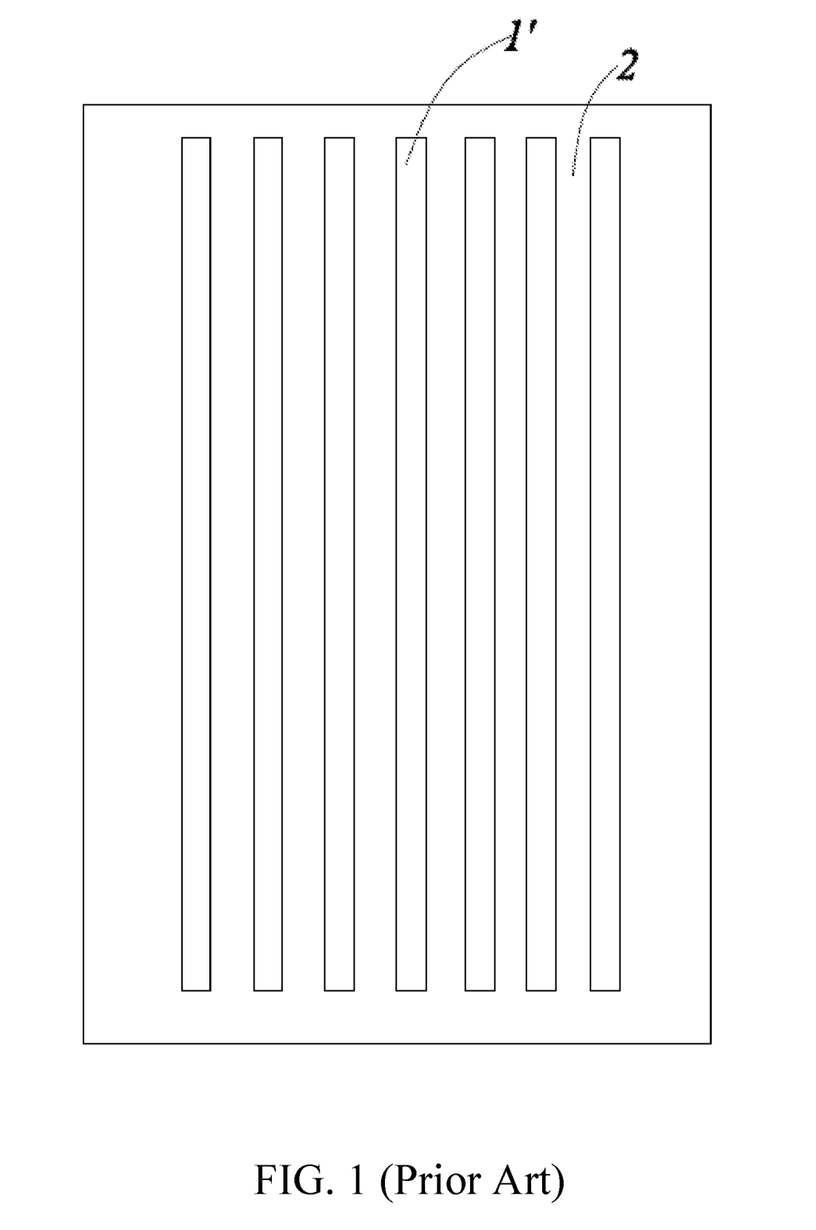
FIG. 1 is a schematic structural diagram of existing frame traces.

As shown in FIG. 1, the existing process scheme for the frame traces of the touch sensor is mainly a printing process, a laser process, and a yellow light process. Regardless of which one process above, narrowing the frame will face the problem of a large increase in costs and a large decrease in the yield. In addition, an insulating area 2 is formed between metal wires 1' of the frame traces, so as to prevent short circuits as result of the contact between adjacent metal wires. Excessively large width and spacing between the metal wires of the frame traces may easily cause an excessively wide frame of the touch display panel.

To this end, it is necessary to provide a new touch sensor and a method for making the same to resolve the foregoing problem.

SUMMARY

The present invention is intended to provide a touch sensor and a method for making the same.

To achieve the foregoing objective, the present invention adopts the following technical solutions:

A touch sensor, comprising a substrate, an electrode layer located on a window area of the substrate, and a frame trace located in a frame trace area of the substrate, the frame trace comprises a plurality of metal wires, and each metal wire comprises a metal wire body electrically connected to a corresponding electrode in the electrode layer and an insulation layer wrapped around an outer periphery of the metal wire body.

As a further improvement of the present invention, a distance between adjacent metal wires is in a range of 0-20 μm.

As a further improvement of the present invention, the plurality of metal wires are arranged in parallel or in a stacked manner.

As a further improvement of the present invention, a material of the insulation layer is acrylic resin, epoxy resin, polyurethane resin, polyethylene, polypropylene, polyvinyl chloride, polystyrene, polymethyl methacrylate, polyester, polyoxymethylene, polyamide, or polyphenylene ether.

As a further improvement of the present invention, the frame trace area has a conductive silver paste electrically connected to the electrode in the electrode layer, and the conductive silver paste contains a propylene glycol monomethyl ether solvent, a benzene solvent, a butyl cellosolve acetate (BCA) solvent, a diethylene glycol butyl ether acetate solvent, a carbitol acetate solvent, or an isophorone solvent.

To achieve the foregoing objective, the present invention also provides a method for making a touch sensor, the method comprising the following steps:
  S1: forming an electrode layer in a window area of a substrate;
  S2: arranging a frame trace for electrical connection with the electrode layer in a frame trace area of the substrate, wherein the frame trace comprises a plurality of metal wires, and each metal wire comprises a metal wire body and an insulation layer wrapped around an outer periphery of the metal wire body; and
  S3: removing the insulation layer of a lapping portion of the metal wire, and electrically connecting the lapping portion to a corresponding electrode in the electrode layer.

As a further improvement of the present invention, step S2 comprises:
  S21: forming a conductive silver paste electrically connected to the electrode in the frame trace area and an adhesive layer on the conductive silver paste; and
  S22: arranging the metal wire on the adhesive layer; or step S2 comprises:
  S2a: forming a conductive silver paste electrically connected to the electrode in the frame trace area;
  S2b: forming an opening in an adhesive layer;
  S2c: arranging metal wires at a position of the adhesive layer corresponding to the frame trace area, wherein at least part of the structure of the lapping portion is located in the opening; and
  S2d: assembling the adhesive layer with metal wires onto the substrate;
  the opening corresponds to the conductive silver paste.

As a further improvement of the present invention, step S3 comprises:
  removing the insulation layer of the lapping portion by means of welding, and welding the lapping portion and the corresponding conductive silver paste together, so that the lapping portion is electrically connected to the corresponding conductive silver paste.

As a further improvement of the present invention, the method for making a touch sensor further comprises S4 after step S3: dispensing or printing a protective adhesive at a joint between the lapping portion and the conductive silver paste, wherein the protective adhesive is silver paste.

As a further improvement of the present invention, step S2 comprises:
  S2A: forming a conductive silver paste electrically connected to the electrode in the frame trace area and/or forming a conductive silver paste which is electrically connected to the electrode on the adhesive layer, wherein the conductive silver paste contains a propylene glycol monomethyl ether solvent, a benzene solvent, a BCA (butyl cellosolve acetate) solvent, a diethylene glycol butyl ether acetate solvent, a carbitol acetate solvent, or an isophorone solvent;

S2B: forming an opening in the adhesive layer;

S2C: arranging metal wires at a position of the adhesive layer corresponding to the frame trace area, wherein at least part of a structure of the lapping portion is located in the opening, and the material of the insulation layer is acrylic resin, polyurethane resin, epoxy resin, polyethylene, polypropylene, polyvinyl chloride, polystyrene, polymethyl methacrylate, polyester, polyoxymethylene, polyamide, or polyphenylene ether; and S2D: assembling the adhesive layer with metal wires onto the substrate;

the opening corresponds to the conductive silver paste, and the conductive silver paste in contact with the lapping portion is a to-be-cured conductive silver paste.

As a further improvement of the present invention, step S3 comprises:

the lapping portion is in contact with the to-be-cured conductive silver paste; and during the curing of the conductive silver paste, the conductive silver paste dissolves the insulation layer of the lapping portion, and the lapping portion and the conductive silver paste are cured together.

As a further improvement of the present invention, step S2 comprises:

S2x: forming a conductive silver paste electrically connected to the electrode in the frame trace area;

S2y: arranging metal wires at a position of the adhesive layer corresponding to the frame trace area, wherein:

the lapping portion corresponds to the conductive silver paste.

As a further improvement of the present invention, step S3 comprises:

forming an opening corresponding to the conductive silver paste on the adhesive layer, and removing the insulation layer of the lapping portion; and assembling the adhesive layer with metal wires onto the substrate, the lapping portion is electrically connected to the corresponding conductive silver paste.

As a further improvement of the present invention, the method for making a touch sensor further comprises S4 after step S3: dispensing or printing a protective adhesive at a joint between the lapping portion and the conductive silver paste, wherein the protective adhesive is silver paste.

Beneficial effects of the present invention are as follows: the touch sensor in the present invention uses metal wires with an insulation layer to replace the silver paste in the traditional process to form frame traces, so as to prevent the electrical contact between adjacent metal wires and cause short circuits. In this way, the distance between adjacent metal wires may be 0, and even a plurality of metal wires may be stacked on each other. Therefore, the width of the frame trace area can be further reduced without increasing the preparation costs of the touch sensor

DETAILED DESCRIPTION

In order to enable those skilled in the art to better understand the technical solutions of the present invention, a touch sensor and a method for making the same provided in the present invention are further described below with reference to the accompany drawings FIGS. 2-6 and specific implementations. Apparently, the described implementations are merely some but not all of the implementations of the present invention. Other implementations obtained by a person of ordinary skill in the art based on the implementations of the invention without creative efforts shall fall within the protection scope of the present invention.

Figure 4:
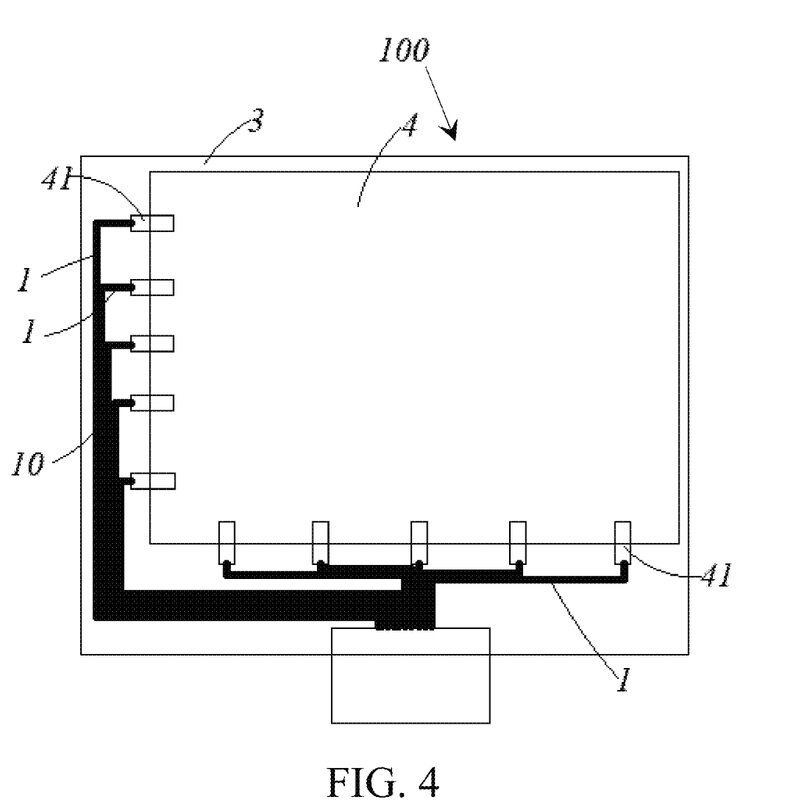
FIG. 4 is a schematic structural diagram of a touch sensor in the present invention.

As shown in FIG. 4, the present invention provides a touch sensor 100, including a substrate 3, an electrode layer 4 formed on the substrate 3, and a frame trace 10 electrically connected to the electrode layer 4. The electrode layer 4 is provided with an electrode 41 electrically connected to the frame trace 10.

Figure 3:
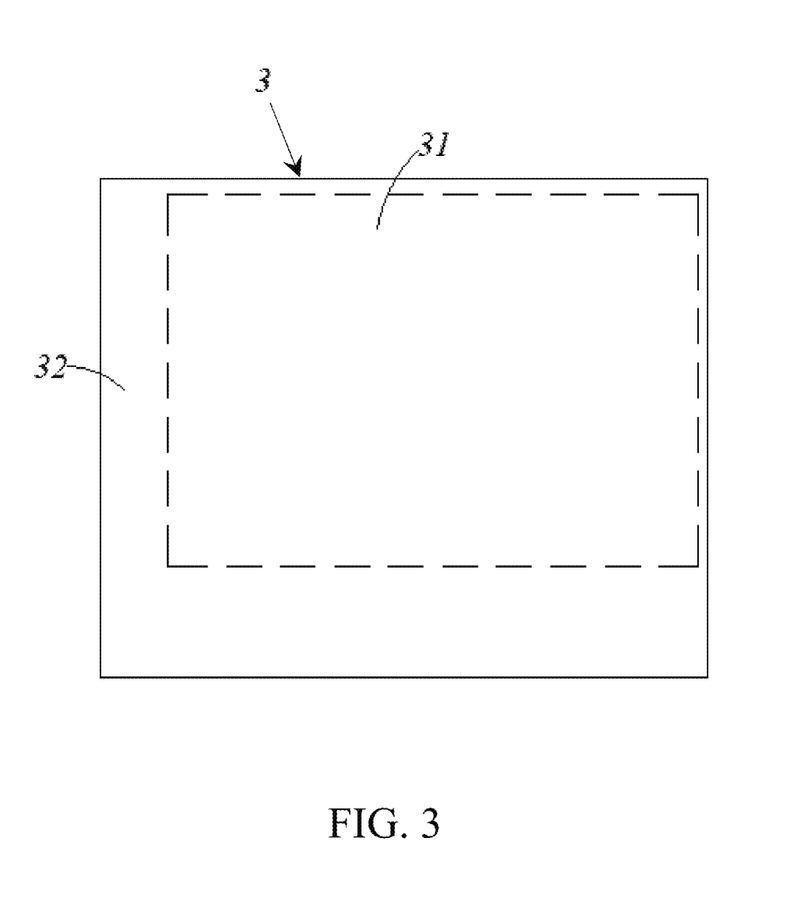
FIG. 3 is a schematic structural diagram of substrate of a touch sensor in the present invention.

Specifically, as shown in FIG. 3, the substrate 3 includes a window area 31 and a frame trace area 32 located on a periphery of the window area 31. The electrode layer 4 is located on the window area 31, and the frame trace 10 is located in the frame trace area 32. Those skilled in the art may also understand that an area where the electrode layer 4 is located constitutes the window area 31 of the touch sensor 100, and the area where the frame trace 10 is located constitutes the frame trace area 32 of the touch sensor 100.

Figure 2:
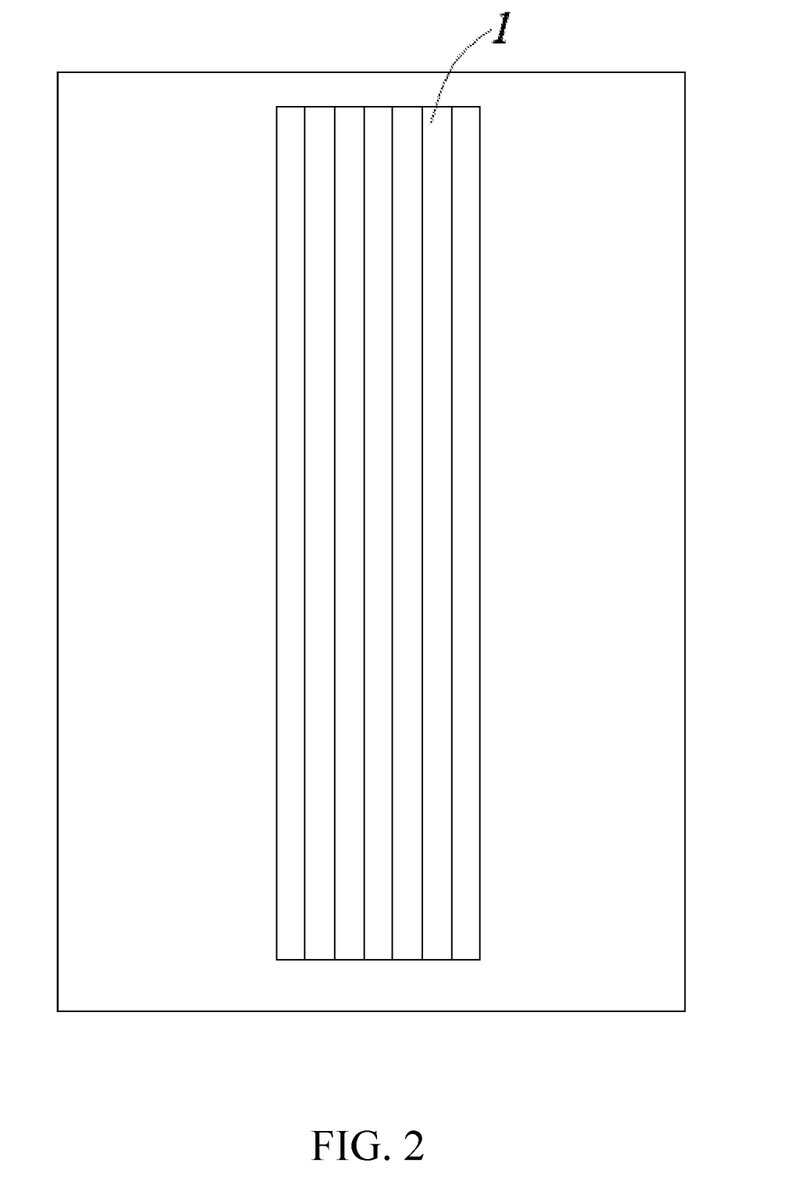
FIG. 2 is a schematic structural diagram of frame traces of a touch sensor according to the present invention.
Figure 5:
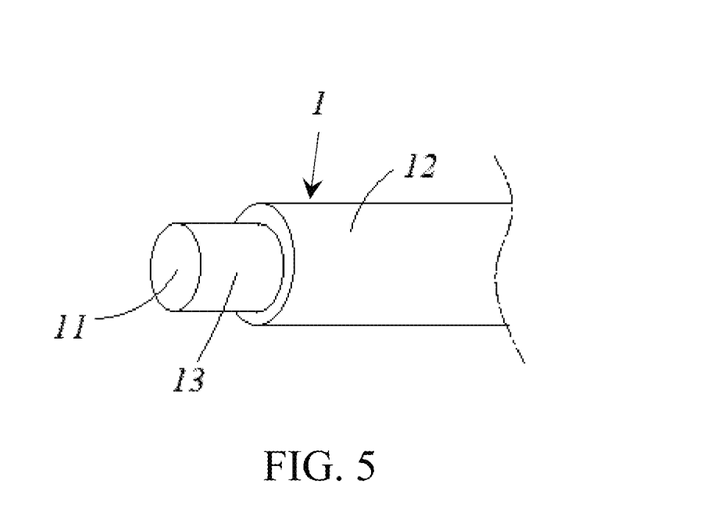
FIG. 5 is a schematic structural diagram of a metal wire.

Further, as shown in FIG. 2 and FIG. 5, the frame trace 10 includes a plurality of metal wires 1, and each metal wire 1 includes a metal wire body 11 electrically connected to a corresponding electrode 41 and an insulation layer 12 wrapped around an outer periphery of the metal wire body 11, so as to prevent short circuits as a result of electrical contact between adjacent metal wires.

Further, a distance between adjacent metal wires 1 is in a range of 0-20 μm, and may be even 0 without causing a short circuit, so as to reduce the width of the frame trace area 32.

Further, the plurality of metal wires 1 are arranged in parallel or in a stacked manner, or the frame traces are formed by stacking a plurality of metal wires 1 to further reduce the width of the frame trace area 32.

It may be understood that the above stacking refers to a plurality of metal wires 1 stacked on each other in a height direction. The stacking includes but is not limited to two metal wires 1 stacked one on top of the other, or metal wires 1 arranged in parallel on an upper layer and metal wires 1 arranged in parallel on a lower layer are arranged alternately, so as to further reduce the width of the frame trace area 32 without increasing the preparation costs of the touch sensor 100.

In addition, a diameter of the metal wire 1 itself is not greater than 15 microns. In this way, it not only can ensure effective electrical contact, and can further reduce the width of the frame trace area 32 without increasing the preparation costs of the touch sensor 100.

In a specific implementation, the metal wire 1 is a copper wire. That is to say, the material of the metal wire body 11 is copper, which has relatively low costs. Certainly, the metal wire may alternatively be other conductive metal wires such as gold wire, silver wire, or the like.

As shown in FIG. 3 to FIG. 6, in a first implementation of the present invention, a method for making a touch sensor 100 is further provided. The method includes the following steps.

Figure 6:
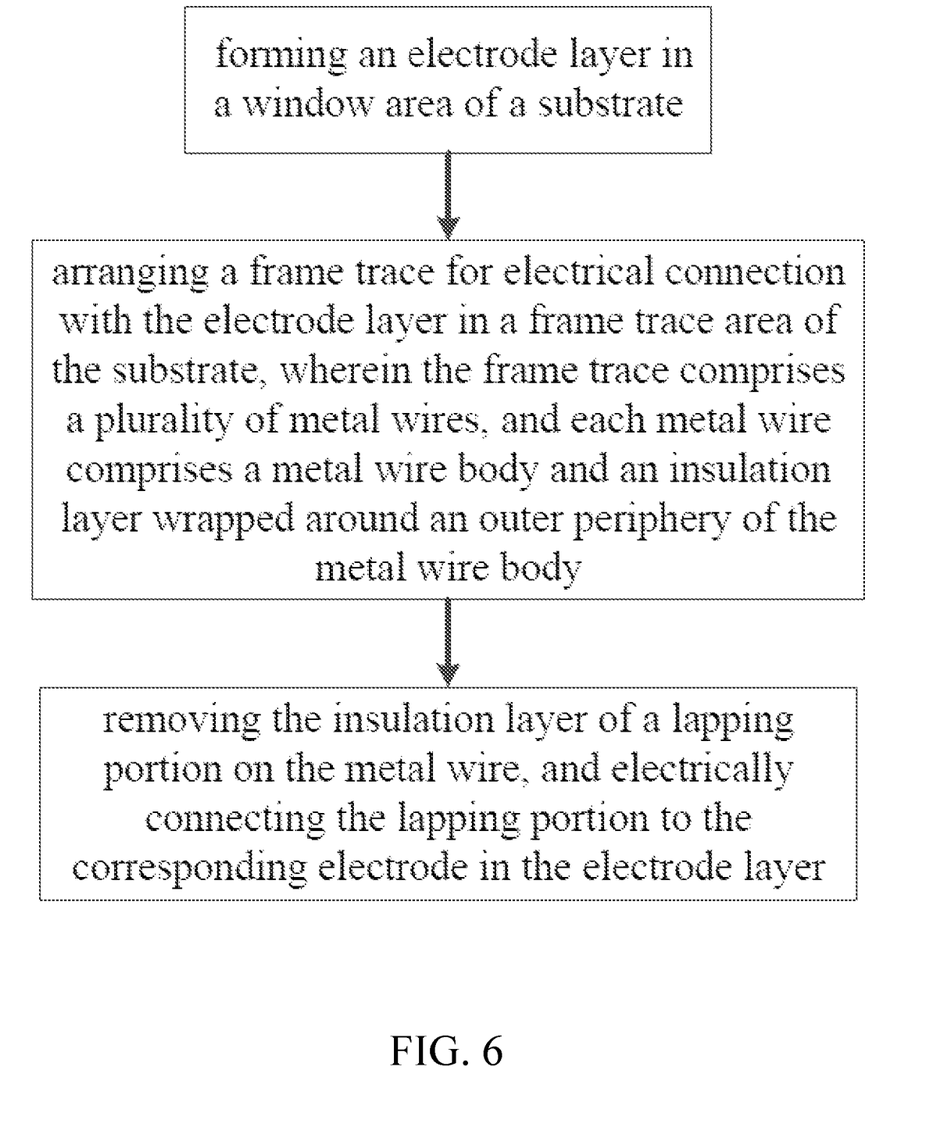
FIG. 6 is a flowchart of a method of making a touch sensor in the present invention.

S1: Forming an electrode layer 4 in the window area 31 of a substrate 3.

S2: Arranging the frame trace 10 for electrical connection with the electrode layer 4 in the frame trace area 32 of the substrate 3, where the frame trace 10 includes a plurality of metal wires 1, and each metal wire 1 includes a metal wire body 11 and an insulation layer 12 wrapped around the outer periphery of the metal wire body 11.

S3: Removing the insulation layer 12 of the lapping portion 13 on the metal wire 1, and electrically connect the lapping portion 13 to the corresponding electrode 41 in the electrode layer 4.

S1, S2, and S3 are just for the convenience of description and do not represent the sequence of steps. The sequence of step S1 and step S2 can be transposed, and step S3 is located after the two steps. In addition, the step numbers in this application are all for convenience of description, and unless otherwise specified, each number does not represent a sequence.

Step S1 includes: performing a patterned etching process on a substrate 3 having a conductive film, so as to form a patterned conductive film in the window area 31 of the substrate 3 and form the electrode layer 4.

In a specific implementation, the etching process is laser etching process. Certainly, the present invention is not limited thereto.

In this implementation, step S2 includes the following steps.

S21: Forming a conductive silver paste electrically connected to the electrode layer 4 in the frame trace area 32 of the substrate 3 and an adhesive layer on the conductive silver paste.

S22: Arranging the metal wire on the adhesive layer.

Specifically, the adhesive layer in step S21 is a pressure-sensitive adhesive printed to the frame trace area 32 to fix the metal wire 1 to the frame trace area 32. Certainly, the present invention is not limited thereto.

Step S22 specifically includes: arranging the metal wire on the adhesive layer by using a wiring machine.

In addition, it may be understood that when the metal wire is arranged on the adhesive layer, the lapping portion 13 on the metal wire is made to correspond to the corresponding conductive silver paste, so that the lapping portion 13 is electrically connected to the conductive silver paste, thereby achieving the electrical connection between the metal wire and the electrode 41. The electrode 41 in the electrode layer 4 is led out by disposing the conductive silver paste, so as to increase the contact area of the electrical connection between the electrode 41 and the metal wire, thereby enhancing the stability of the electrical connection between the metal wire and the electrode 41.

Based on the above first implementation, step S3 includes: removing the insulation layer 12 of the lapping portion 13 by means of welding, and welding the lapping portion 13 and the conductive silver paste together, so that the lapping portion 13 is electrically connected to the corresponding conductive silver paste.

In this implementation, the insulation layer 12 has thermal decomposition properties. For example, a material of the insulation layer 12 may be acrylic resin, epoxy resin, polyurethane resin, polyethylene, polypropylene, polyvinyl chloride, polystyrene, polymethyl methacrylate, polyester, polyoxymethylene, polyamide, polyphenylene ether, or the like.

In this way, during the welding, under the action of the welding heat, the insulation layer 12 on the lapping portion 13 can be removed, and the lapping portion 13 and the conductive silver paste can be welded together to achieve the electrical connection between the lapping portion 13 and the corresponding conductive silver paste.

Further, the method for making the touch sensor 100 further includes step S4 after step S3: dispensing or printing the protective adhesive at a joint between the lapping portion 13 and the conductive silver paste. In this way, a solder joint between the lapping portion 13 and the corresponding conductive silver paste is protected, and the stability of the electrical connection between the lapping portion 13 and the corresponding conductive silver paste can be enhanced.

Specifically, the protective adhesive is silver paste.

Specifically, in this implementation, a silver paste is dispensed or printed at the joint between the lapping portion 13 and the corresponding conductive silver paste by using a dispenser or a screen printing process, which is convenient to operate. Certainly, the present invention is not limited thereto.

In a specific implementation of making a touch sensor 100 according to the first implementation of the present invention, the making method is as follows.

Making a substrate 3 having a conductive film or forming a conductive film on the substrate 3. The conductive film is etched by using the laser process to form an electrode layer 4 in the window area 31 of the substrate 3. After the etching by using the laser process, the conductive silver paste electrically connected to the electrode 41 in the electrode layer 4 is printed in the frame trace area 32 of the substrate 3. After the conductive silver paste is printed, the pressure-sensitive adhesive is printed on the frame trace area 32, and then copper wires are arranged on the pressure-sensitive adhesive by using a wiring machine. After the copper wires are arranged, the insulation layer 12 of the lapping portion 13 of the copper wire is removed by means of welding, at the same time the lapping portion 13 and the corresponding conductive silver paste are welded together and connected. Finally, a silver paste is dispensed, by using a dispenser, at a joint between the lapping portion 13 of the copper wire and the conductive silver paste to protect a solder joint between the lapping portion 13 and the conductive silver paste.

It may be understood that a touch display screen includes two touch sensors. One touch sensor 100 serves as a driving layer, and another serves as a receiving layer, to sense human body touch signals in cooperation with work to complete the positioning of the touch position.

In addition, the methods for making the driving layer and the receiving layer are the same, and both the driving layer and the receiving layer can be made by using the making method in the above first implementation.

In the second implementation of the present invention, the method for making a touch sensor 100 in the second implementation differs from that in the first implementation only in step S2, and the other steps S1, S3, and S4 are the same. Details will not be described herein again.

In this implementation, step S2 specifically includes the following steps.

S2a: Forming a conductive silver paste electrically connected to the electrode 41 in the frame trace area 32.

S2b: Forming an opening in the adhesive layer.

S2c: Arranging metal wires at a position of the adhesive layer corresponding to the frame trace area 32, where at least part of the structure of the lapping portion 13 is located in the opening.

S2d: Assembling the adhesive layer with metal wires onto the substrate 3.

The opening corresponds to the conductive silver paste.

S2a, S2b, S2c, and S2d are just for the convenience of description and do not represent the sequence of steps. The sequence of step S2a and step S2b can be transposed or can be performed simultaneously, and the sequence of step S2a and step S2c can be transposed or can be performed simultaneously, as long as it is ensured that the opening finally corresponds to the conductive silver paste. As a result, step S2c is after step S2b, and step S2d is after step S2c. In addition, the step numbers in this application are all for convenience of description, and unless otherwise specified, each number does not represent a sequence.

Specifically, the adhesive layer in the second implementation is optically clear adhesive (OCA), so as to be easily bonded to other components of the touch display screen by means of bonding. For example, the touch display screen includes two touch sensors. One touch sensor 100 serves as a driving layer, and another serves as a receiving layer, to sense human body touch signals in cooperation with work to complete the positioning of the touch position. In this way, the OCA can bond the driving layer and the receiving layer.

Certainly, the present invention is not limited thereto. For example, the adhesive layer may also be a pressure-sensitive adhesive film. Compared with the adhesive layer being OCA, the advantage is that the pressure-sensitive adhesive film is a single-sided adhesive film, which is an ordinary scotch tape and easy to operate during the production.

The above step S2b is specifically forming an opening corresponding to the conductive silver paste on the adhesive layer by using laser drilling process.

Further, step S2c specifically includes: arranging the metal wire on the adhesive layer by using a wiring machine.

In addition, it may be understood that when the metal wire is arranged on the adhesive layer, at least part of the structure of the lapping portion 13 on the metal wire is located in the opening, and the opening corresponds to the conductive silver paste. In this way, after the adhesive layer provided with metal wires is connected to the substrate 3, the lapping portion 13 is aligned to the conductive silver paste corresponding to the lapping portion 13. This facilitates the electrical connection between the lapping portion 13 and the conductive silver paste, thereby achieving the electrical connection between the metal wire and the electrode 41.

The electrode 41 is led out by disposing the conductive silver paste, so as to increase a contact area of the electrical connection between the electrode 41 and the metal wire, thereby enhancing the stability of the electrical connection between the metal wire and the electrode 41.

It may be understood that, after the adhesive layer provided with metal wires is bonded to the substrate 3, a side provided with the metal wires on the adhesive layer and a side provided with the electrode layer 4 on the substrate 3 are disposed opposite to and abutting against each other, so as to indirectly arrange frame traces for electrical connection to the electrode layer 4 in the frame trace area 32 of the substrate 3. In addition, the lapping portion 13 is aligned to the conductive silver paste corresponding to the lapping portion 13, so that the lapping portion 13 is electrically connected to the corresponding conductive silver paste subsequently.

It may be understood that, in step S3 of the second implementation, during the welding, a corresponding welding head is extended from the opening. Under the action of welding heat, the insulation layer 12 of the lapping portion 13 is removed. The lapping portion 13 and the corresponding conductive silver paste are welded together, thereby achieving the electrical connection between the lapping portion 13 and the corresponding conductive silver paste.

In a specific implementation of making a touch sensor 100 according to the second implementation of the present invention, the making method is as follows.

A substrate 3 having a conductive film is made or a conductive film is formed on the substrate 3. The conductive film is etched by using a laser process to form an electrode layer 4 in the window area 31 of the substrate 3. After the etching by using the laser process, the conductive silver paste electrically connected to the electrode 41 in the electrode layer 4 is printed in the frame trace area 32 of the substrate 3. In addition, the OCA for bonding is made, an opening is formed on the OCA by using laser, and then copper wires are arranged on the OCA by using a wiring machine. After the copper wires are arranged, the OCA bonded to the substrate 3. At this point, a side of the OCA having the copper wire is arranged opposite to a side provided with the electrode layer 4 on the substrate 3, and the opening corresponds to the conductive silver paste. After the bonding, the insulation layer 12 of the lapping portion 13 of the copper wire is removed by means of welding, and the lapping portion 13 and the corresponding conductive silver paste are welded together and connected. Finally, a silver paste is dispensed, by using a dispenser, at a joint between the lapping portion 13 of the copper wire and the conductive silver paste to protect a solder joint between the lapping portion 13 and the conductive silver paste.

It may be understood that, the touch display screen includes two touch sensors. One touch sensor 100 serves as a driving layer, and another serves as a receiving layer, to sense human body touch signals in cooperation with work to complete the positioning of the touch position. In this way, the OCA can bond the driving layer and the receiving layer. After the bonding, the structure of the touch display screen is successively a cover plate+the touch sensor 100 as the receiving layer+the touch sensor 100 as the driving layer. It may be understood that, the OCA on the touch sensor 100 as the receiving layer bonds the touch sensor 100 as the receiving layer and the cover plate, and the OCA on the touch sensor 100 as the driving layer bonds the driving layer and the receiving layer.

In addition, the methods for making the driving layer and the receiving layer are the same, and both the driving layer and the receiving layer can be made by using the making method in the above second implementation.

It may be understood that, when the adhesive layer is a pressure-sensitive adhesive film, the structure of the touch sensor 100 after the final bonding is successively: the cover plate+the OCA+the touch sensor 100 as the receiving layer+ the OCA+the touch sensor 100 as the driving layer.

In addition, the corresponding method for making a touch sensor 100 when the adhesive layer is a pressure-sensitive adhesive film is similar to the method when the adhesive layer is the OCA. Therefore, details will not be described herein again.

In the third implementation of the present invention, the method for making a touch sensor 100 in the third implementation differs from that in the first implementation only in steps S2 and S3, and the other steps S1 and S4 are the same. Details will not be described herein again. In this implementation, step S2 specifically includes the following steps.

S2A: Forming a conductive silver paste electrically connected to the electrode 41 in the frame trace area 32 and/or forming a conductive silver paste can electrically connected to the electrode on the adhesive layer, where the conductive silver paste contains a propylene glycol monomethyl ether solvent, a benzene solvent, a butyl cellosolve acetate (BCA) solvent, a diethylene glycol butyl ether acetate solvent, a carbitol acetate solvent, an isophorone solvent, or the like.

S2B: Forming an opening in the adhesive layer.

S2C: Arranging metal wires at a position of the adhesive layer corresponding to the frame trace area 32, where at least part of a structure of the lapping portion 13 is located in the opening, and the material of the insulation layer 12 is acrylic resin, polyurethane resin, epoxy resin, polyethylene, polypropylene, polyvinyl chloride, polystyrene, polymethyl methacrylate, polyester, polyoxymethylene, polyamide, polyphenylene ether, or the like.

S2D: Assembling the adhesive layer with metal wires onto the substrate 3.

The opening corresponds to the conductive silver paste. The conductive silver paste in contact with the lapping portion 13 is a to-be-cured conductive silver paste.

S2A, S2B, S2C, and S2D are just for the convenience of description and do not represent the sequence of steps. The sequence of step S2A and step S2B can be transposed or can be performed simultaneously, and the sequence of step S2A and step S2C can be transposed or can be performed simultaneously, as long as it is ensured that the opening finally corresponds to the conductive silver paste. As a result, step S2C is after step S2B, and step S2D is after step S2C. In addition, the step numbers in this application are all for convenience of description, and unless otherwise specified, each number does not represent a sequence.

In a specific implementation, the conductive silver paste contains BCA. Certainly, the present invention is not limited thereto.

Specifically, the adhesive layer in this implementation is the same as the adhesive layer in the second implementation, which may be an OCA or a pressure-sensitive adhesive film. The structure of the touch display screen after the final bonding is also the same. Details will not be described herein again.

The above step S2B is specifically forming an opening corresponding to the conductive silver paste on the adhesive layer by using a laser drilling process.

Further, step S2C specifically includes: arranging the metal wire on the adhesive layer by using a wiring machine.

In a specific implementation, in step S2A, a to-be-cured conductive silver paste electrically connected to an electrode 41 is formed in the frame trace area 32. In addition, when the metal wire is arranged on the adhesive layer, at least part of a structure of the lapping portion 13 on the metal wire is located in the opening, and the opening corresponds to the conductive silver paste. In this way, after the adhesive layer provided with metal wires is connected to the substrate 3, the lapping portion 13 is aligned to and in contact with the conductive silver paste corresponding to the lapping portion 13. During the curing of the conductive silver paste, the BCA solvent in the conductive silver paste dissolves the insulation layer 12 of the lapping portion 13, so that the lapping portion 13 and the conductive silver paste are cured together, thereby achieving the electrical connection between the metal wire and the electrode 41.

Certainly, it may be understood that, in step S2A, a to-be-cured conductive silver paste that can be electrically connected to the electrode 41 may also be formed on the adhesive layer. In this way, after metal wires are printed on the adhesive layer, the lapping portion 13 is in contact with the corresponding to-be-cured conductive silver paste. In this way, after the adhesive layer provided with metal wires is connected to the substrate 3, during the curing of the conductive silver paste, the BCA solvent in the conductive silver paste dissolves the insulation layer 12 of the lapping portion 13, so that the lapping portion 13 and the conductive silver paste are cured together, thereby achieving the electrical connection between the metal wire and the electrode 41. In addition, the conductive silver paste is electrically connected to the electrode 41 of the electrode layer 4.

Alternatively, in step S2A, the conductive silver paste may also be formed on both the adhesive layer and the frame trace area 32. It may be understood that, at this point, the conductive silver paste in the frame trace area 32 may be cured or to be cured, as long as the conductive silver paste of the adhesive layer is disposed to be cured to dissolve the insulation layer 12 of the lapping portion 13, thereby achieving the electrical connection between the lapping portion 13 and the conductive silver paste in the frame trace area 32.

The electrode 41 is led out by disposing the conductive silver paste, so as to increase a contact area of the electrical connection between the electrode 41 and the metal wire, thereby enhancing the stability of the electrical connection between the metal wire and the electrode 41.

It may be understood that, except for the above solvents, the components of the conductive silver paste may be the same as those of the existing conductive silver paste, such as additives, silver particles, and the like. Details will not be described herein again.

It may be understood that, after the adhesive layer provided with metal wires is bonded to the substrate 3, a side provided with the metal wires on the adhesive layer and a side provided with the electrode layer 4 on the substrate 3 are disposed opposite to and abutting against each other, so as to indirectly arrange frame traces for electrical connection to the electrode layer 4 in the frame trace area 32 of the substrate 3. In addition, the lapping portion 13 is aligned to the corresponding to-be-cured conductive silver paste. In this way, during the curing of the conductive silver paste, the BCA solvent in the conductive silver paste dissolves the insulation layer 12 of the lapping portion 13, so that the lapping portion 13 and the conductive silver paste are cured together, thereby achieving the electrical connection between the metal wire and the electrode 41.

In this implementation, step S3 specifically includes the following steps.

The lapping portion 13 is in contact with the to-be-cured conductive silver paste.

During the curing of the conductive silver paste, the BCA solvent in the conductive silver paste dissolves the insulation layer 12 of the lapping portion 13, and the lapping portion 13 and the conductive silver paste are cured together.

It may be understood that, during the curing of the conductive silver paste, the BCA solvent in the conductive silver paste dissolves the insulation layer 12 on the lapping portion 13, so that the lapping portion 13 and the conductive silver paste are cured together, thereby achieving the electrical connection between the lapping portion 13 and the corresponding conductive silver paste. That is to say, in this implementation, the electrical connection is performed by using the BCA solvent in the conductive silver paste to destroy the wire insulation layer 12.

In a specific implementation of making a touch sensor 100 according to the third implementation of the present invention, the making method is as follows.

A substrate 3 having a conductive film is made or a conductive film is formed on the substrate 3. The conductive film is etched to form an electrode layer 4 in the window area 31 of the substrate 3. After the etching by using the laser process, the to-be-cured conductive silver paste electrically connected to the electrode 41 in the electrode layer 4 is printed in the frame trace area 32 of the substrate 3. In addition, the OCA for bonding is made, an opening is formed on the OCA by using laser, and then copper wires are arranged on the OCA by using a wiring machine. After the copper wires are arranged, the OCA bonded to the substrate 3. At this point, a side of the OCA having the copper wire is arranged opposite to a side provided with the electrode layer 4 on the substrate 3, and the opening corresponds to the conductive silver paste. After the bonding, during the curing of the conductive silver paste, the BCA solvent in the conductive silver paste dissolves the insulation layer 12 on the lapping portion 13, so that the lapping portion 13 and the conductive silver paste are cured together, thereby achieving the electrical connection between the lapping portion 13 and the corresponding conductive silver paste. Finally, a silver paste is dispensed, by using a dispenser, at a joint between the lapping portion 13 of the copper wire and the conductive silver paste to protect a connection point between the lapping portion 13 and the conductive silver paste.

It may be understood that a touch display screen includes two touch sensors. One touch sensor 100 serves as a driving layer, and another serves as a receiving layer, to sense human body touch signals in cooperation with work to complete the positioning of the touch position.

In addition, the methods for making the driving layer and the receiving layer are the same, and both the driving layer and the receiving layer can be made by using the making method in the above third implementation.

In the fourth implementation of the present invention, the method for making a touch sensor 100 in the fourth implementation differs from that in the first implementation only in steps S2 and S3, and the other steps S1 and S4 are the same. Details will not be described herein again.

In this implementation, step S2 specifically includes the following steps.

S2x: Forming a conductive silver paste electrically connected to the electrode 41 in the frame trace area 32.

S2y: Arranging metal wires at a position of the adhesive layer corresponding to the frame trace area 32.

The lapping portion 13 corresponds to the conductive silver paste.

S2x and S2y are just for the convenience of description and do not represent the sequence of steps. The sequence of step S2x and step S2y can be transposed, as long as it is ensured that the lapping portion 13 finally corresponds to the corresponding conductive silver paste. In addition, the step numbers in this application are all for convenience of description, and unless otherwise specified, each number does not represent a sequence.

In step S2x, the electrode 41 in the electrode layer 4 is led out by disposing the conductive silver paste, so as to increase a contact area of the electrical connection between the electrode 41 and the subsequent metal wire, thereby enhancing the stability of the electrical connection between the metal wire and the electrode 41.

Specifically, step S2y specifically includes: arranging the metal wire on the adhesive layer by using a wiring machine.

In addition, the lapping portion 13 is finally caused to correspond to the conductive silver paste, so that the lapping portion 13 is electrically connected to the corresponding conductive silver paste subsequently.

Specifically, the adhesive layer in this implementation is the OCA, so as to be easily bonded to other components of the touch display screen by means of bonding. For example, the touch display screen includes two touch sensors. One touch sensor 100 serves as a driving layer, and another serves as a receiving layer, to sense human body touch signals in cooperation with work to complete the positioning of the touch position. In this way, the OCA can bond the driving layer and the receiving layer.

In this implementation, step S3 specifically includes the following steps.

S31: Forming an opening corresponding to the conductive silver paste on the adhesive layer, and remove the insulation layer 12 of the lapping portion 13.

S32: Assembling the adhesive layer with metal wires onto the substrate 3, the lapping portion 13 is electrically connected to the corresponding conductive silver paste.

Specifically, step S31 of forming the opening corresponding to the conductive silver paste on the adhesive layer specifically includes: forming an opening corresponding to the conductive silver paste on the adhesive layer by using a laser drilling process.

It may be understood that the opening corresponds to the corresponding conductive silver paste, and the lapping portion 13 corresponds to the corresponding conductive silver paste, so that at least part of the structure of the lapping portion 13 is located at a position where an opening is to be formed. During the laser drilling, the laser may simultaneously remove the insulation layer 12 of the lapping portion 13 at the opening. Therefore, after the adhesive layer provided with metal wires is bonded to the substrate 3, a side provided with the metal wires on the adhesive layer and a side provided with the electrode layer 4 on the substrate 3 are disposed opposite to and abutting against each other. The opening corresponds to the conductive silver paste, and the lapping portion 13 without the insulation layer 12 is directly in contact with the conductive silver paste, thereby achieving the electrical connection between the lapping portion 13 and the corresponding conductive silver paste.

Compared with the second implementation, in the fourth implementation of the present invention, the metal wire is first arranged on the adhesive layer, and then drilling is performed. In this way, the insulation layer 12 of the lapping portion 13 can be removed during drilling, so as to omit the subsequent step of removing the insulation layer 12 of the lapping portion 13 and welding the lapping portion 13 to the corresponding conductive silver paste, thereby reducing the preparation costs.

In a specific implementation of making a touch sensor 100 according to the fourth implementation of the present invention, the making method is as follows.

A substrate 3 having a conductive film is made or a conductive film is formed on the substrate 3. The conductive film is etched by using a laser process to form an electrode layer in the window area 31 of the substrate 3. After the etching by using the laser process, the conductive silver paste electrically connected to the electrode 41 in the electrode layer 4 is printed in the frame trace area 32 of the substrate 3. In addition, the OCA for bonding is made, and copper wires are arranged on the OCA by using a wiring machine. After the copper wires are arranged, an opening is formed on the OCA by using a laser, and the insulation layer 12 of the lapping portion 13 at the opening is removed. Then the OCA is bonded to the substrate 3. At this point, a side of the OCA having the copper wire is arranged opposite to a side provided with the electrode layer 4 on the substrate 3, the opening corresponds to the conductive silver paste, and the lapping portion 13 is in contact with the corresponding conductive silver paste. After the bonding, a silver paste is dispensed, by using a dispenser, at a joint between the lapping portion 13 of the copper wire and the conductive silver paste to protect a connection point between the lapping portion 13 and the conductive silver paste.

In addition, the methods for making the driving layer and the receiving layer in the touch display screen are the same, and both the driving layer and the receiving layer can be made by using the making method in the above fourth implementation.

Based on the above, the touch sensor 100 in the present invention uses metal wires with an insulation layer 12 to replace the silver paste in the traditional process to form frame traces, so as to prevent the electrical contact between adjacent metal wires and cause short circuits. In this way, the distance between adjacent metal wires may be 0, and even a plurality of metal wires may be stacked on each other. Therefore, the width of the frame trace area 32 can be further reduced without increasing the preparation costs of the touch sensor 100.

It should be understood that, although this specification is described according to each implementation, each implementation may not include only one independent technical solution. The description manner of this specification is merely for clarity. This specification should be considered as a whole by a person skilled in the art, and the technical solution in each implementation may also be properly combined, to form other implementations that can be understood by a person skilled in the art.

The series of detailed descriptions listed above are merely specific descriptions of feasible implementations of the present invention, and are not intended to limit the protection scope of the present invention. Any equivalent implementations or changes made without departing from the technical spirit of the present invention shall fall within the protection scope of the present invention.

What is claimed is:

1. A method for making a touch sensor, the method comprising steps of:
    forming an electrode layer in a window area of a substrate;
    arranging a frame trace in a frame trace area of the substrate located on a periphery of the window area for electrical connection with the electrode layer, wherein the frame trace comprises a plurality of metal wires, and each metal wire comprises a metal wire body and an insulation layer wrapped around an outer periphery of the metal wire body; and
    removing the insulation layer of a lapping portion of the metal wire, and electrically connecting the lapping portion to a corresponding electrode in the electrode layer;
    wherein the arranging the frame trace comprises:
    forming a conductive silver paste electrically connected to the electrode in the frame trace area and an adhesive layer on the conductive silver paste; and
    arranging the metal wire on the adhesive layer; or
    the step of arranging the frame trace comprises:
    forming a conductive silver paste electrically connected to the electrode in the frame trace area;
    forming an opening in an adhesive layer;
    arranging metal wires at a position of the adhesive layer corresponding to the frame trace area, wherein at least part of the structure of the lapping portion is located in the opening; and
    assembling the adhesive layer with metal wires onto the substrate;
    the opening corresponds to the conductive silver paste.

2. The method for making a touch sensor according to claim 1, wherein the removing the insulation layer and electrically connecting the lapping portion comprises:
    removing the insulation layer of the lapping portion by means of welding, and welding the lapping portion and the corresponding conductive silver paste together, so that the lapping portion is electrically connected to the corresponding conductive silver paste.

3. The method for making a touch sensor according to claim 2, wherein after the removing the insulation layer and electrically connecting the lapping portion, the method for making a touch sensor further comprises: dispensing or printing a protective adhesive at a joint between the lapping portion and the conductive silver paste, wherein the protective adhesive is silver paste.

4. A method for making a touch sensor, the method comprising steps of:
    forming an electrode layer in a window area of a substrate;
    arranging a frame trace in a frame trace area of the substrate located on a periphery of the window area for electrical connection with the electrode layer, wherein the frame trace comprises a plurality of metal wires, and each metal wire comprises a metal wire body and an insulation layer wrapped around an outer periphery of the metal wire body; and
    removing the insulation layer of a lapping portion of the metal wire, and electrically connecting the lapping portion to a corresponding electrode in the electrode layer;
    wherein the arranging the frame trace comprises:
    forming a conductive silver paste electrically connected to the electrode in the frame trace area and/or forming a conductive silver paste which is electrically connected to the electrode on the adhesive layer, wherein the conductive silver paste contains a propylene glycol monomethyl ether solvent, a benzene solvent, a BCA (butyl cellosolve acetate) solvent, a diethylene glycol butyl ether acetate solvent, a carbitol acetate solvent, or an isophorone solvent;
    forming an opening in the adhesive layer;
    arranging metal wires at a position of the adhesive layer corresponding to the frame trace area, wherein at least part of a structure of the lapping portion is located in the opening, and the material of the insulation layer is acrylic resin, polyurethane resin, epoxy resin, polyethylene, polypropylene, polyvinyl chloride, polystyrene, polymethyl methacrylate, polyester, polyoxymethylene, polyamide, or polyphenylene ether; and
    assembling the adhesive layer with metal wires onto the substrate;
    the opening corresponds to the conductive silver paste, and the conductive silver paste in contact with the lapping portion is a to-be-cured conductive silver paste.

5. The method for making a touch sensor according to claim 4, wherein the removing the insulation layer and electrically connecting the lapping portion comprises:
    the lapping portion is in contact with the to-be-cured conductive silver paste; and
    during the curing of the conductive silver paste, the conductive silver paste dissolves the insulation layer of the lapping portion, and the lapping portion and the conductive silver paste are cured together.

6. The method for making a touch sensor according to claim 5, wherein after the removing the insulation layer and electrically connecting the lapping portion, the method for making a touch sensor further comprises: dispensing or printing a protective adhesive at a joint between the lapping portion and the conductive silver paste, wherein the protective adhesive is silver paste.

7. A method for making a touch sensor, the method comprising steps of:
   forming an electrode layer in a window area of a substrate;
   arranging a frame trace in a frame trace area of the substrate located on a periphery of the window area for electrical connection with the electrode layer, wherein the frame trace comprises a plurality of metal wires, and each metal wire comprises a metal wire body and an insulation layer wrapped around an outer periphery of the metal wire body; and
   removing the insulation layer of a lapping portion of the metal wire, and electrically connecting the lapping portion to a corresponding electrode in the electrode layer;
   wherein the arranging the frame trace comprises:
   forming a conductive silver paste electrically connected to the electrode in the frame trace area;
   arranging metal wires at a position of the adhesive layer corresponding to the frame trace area, wherein:
   the lapping portion corresponds to the conductive silver paste.

8. The method for making a touch sensor according to claim 7, wherein the removing the insulation layer and electrically connecting the lapping portion comprises:
   forming an opening corresponding to the conductive silver paste on the adhesive layer, and removing the insulation layer of the lapping portion; and
   assembling the adhesive layer with metal wires onto the substrate, the lapping portion is electrically connected to the corresponding conductive silver paste.

9. The method for making a touch sensor according to claim 8, wherein after the removing the insulation layer and electrically connecting the lapping portion, the method for making a touch sensor further comprises: dispensing or printing a protective adhesive at a joint between the lapping portion and the conductive silver paste, wherein the protective adhesive is silver paste.

* * * * *